(12) United States Patent
Takahashi (10) Patent No.: US 7,559,003 B2
(45) Date of Patent: Jul. 7, 2009

(54) SEMICONDUCTOR MEMORY TEST APPARATUS

(75) Inventor: Yasunao Takahashi, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 214 days.

(21) Appl. No.: 11/191,013

(22) Filed: Jul. 28, 2005

(65) Prior Publication Data
US 2006/0023526 A1 Feb. 2, 2006

(30) Foreign Application Priority Data
Jul. 30, 2004 (JP) .............................. 2004-224670

(51) Int. Cl.
*G01R 31/28* (2006.01)

(52) U.S. Cl. ...................... 714/742; 714/736

(58) Field of Classification Search ................ 714/703, 714/704, 742, 736, 724, 718, 738, 725, 726, 714/735, 819; 365/201, 200, 189.05, 236; 375/372, 354
See application file for complete search history.

(56) References Cited

U.S. PATENT DOCUMENTS

| | | | | |
|---|---|---|---|---|
| 5,014,226 A | * | 5/1991 | Horstmann et al. ............ 716/4 |
| 5,266,894 A | * | 11/1993 | Takagi et al. ................. 324/765 |
| 5,323,426 A | * | 6/1994 | James et al. ................. 375/372 |
| 5,436,559 A | * | 7/1995 | Takagi et al. ............. 324/158.1 |
| 5,588,115 A | * | 12/1996 | Augarten ...................... 714/29 |
| 6,035,427 A | * | 3/2000 | Kweon ........................ 714/702 |
| 6,134,675 A | * | 10/2000 | Raina ........................... 714/37 |
| 6,732,205 B2 | * | 5/2004 | Kamihara et al. ............. 710/71 |
| 6,754,858 B2 | * | 6/2004 | Borkenhagen et al. ...... 714/720 |
| 7,007,212 B2 | * | 2/2006 | Komatsu et al. ............. 714/724 |
| 7,154,944 B2 | * | 12/2006 | Jungerman .................. 375/224 |
| 7,242,736 B2 | * | 7/2007 | Schanke et al. ............. 375/372 |
| 2005/0243609 A1 | * | 11/2005 | Yang et al. ............. 365/189.05 |
| 2005/0289062 A1 | * | 12/2005 | Hori et al. ...................... 705/51 |

FOREIGN PATENT DOCUMENTS

JP 09-097194 4/1997

* cited by examiner

*Primary Examiner*—Phung M Chung
(74) *Attorney, Agent, or Firm*—McDermott Will & Emery LLP (57) ABSTRACT

A semiconductor memory test apparatus has a log data generating unit for generating log data indicating a test result of a device under test based on output data from the device under test corresponding to a predetermined test pattern; and a log data storing unit for writing the generated log data sequentially and reading the stored log data sequentially. The log data storing unit, having a dual port structure, includes a memory portion, an input port and an output port.

5 Claims, 11 Drawing Sheets

LOG DATA

| PATTERN ADDRESS | DEVICE NUMBER | DEVICE ADDRESS | | | OUTPUT DATA | | EXPECTED VALUE DATA | |
|---|---|---|---|---|---|---|---|---|
| | | BANK | ROW | COLUMN | DATA 0 | DATA 1 | DATA 0 | DATA 1 |
| 10 | 0 | 1 | 0C | 10 | 80 | FF | 0 | FF |
| 10 | 1 | 0 | DF | 80 | 4 | FF | 0 | FF |
| 30 | 3 | 0 | 0 | 1A0 | 0 | 8F | 0 | FF |
| 80 | 1 | 0 | 0 | 0 | 0 | 0 | 0 | FF |
| 10 | 4 | 1 | 0C | 10 | 80 | FF | 0 | FF |
| 30 | 1 | 0 | 2A | 200 | FF | FF | 0 | FF |
| ...... | ...... | ...... | ...... | ...... | ...... | ...... | ...... | ...... |

FIG.11

SEMICONDUCTOR MEMORY TEST APPARATUS

FIELD OF THE INVENTION

The present invention relates to a semiconductor memory test apparatus which applies test patterns to a semiconductor memory to carry out a test, and more particularly, to a semiconductor memory test apparatus which applies test patterns to a synchronous type semiconductor memory which is operated in synchronization with a clock having a predetermined period, and stores log data indicative of a test result in a log memory.

RELATED ART

When a test of a semiconductor memory such as a DRAM (Dynamic Random Access Memory) is conducted, it is general to make evaluations using test patterns corresponding to various test contents using a commercially available general-purpose test apparatus. Such a general-purpose semiconductor memory test apparatus is configured such that in order to analyze a test result concerning a device under test, failure information obtained in correspondence with the test pattern is written into a memory sequentially. In recent years, the speed of the semiconductor memories become faster and its capacity becomes larger and a test tends to takes a long time. Therefore, when a test corresponding to such a semiconductor memory is to be carried out, it is necessary to prepare a high-speed and large-capacity memory to store the test result.

Memories for storing test results mounted on conventional semiconductor memory test apparatus can roughly be divided into the following two kinds of configurations. According to a first configuration, an address fail memory having the same storage capacity as that of a device under test is provided, and matrix flags indicating whether all X and Y addresses of the device are failed or not are stored in the address fail memory sequentially (see Japanese Patent Application Laid-open No. 9-97194). According to a second configuration, a series of information (log data) such as filed addresses corresponding to the device under test, output data attached thereon, identification data of the device under test, test patterns and the like are generated and written into a log memory.

According to the first conventional configuration, however, since it is necessary to prepare a high-speed address fail memory having the same capacity as that of the device under test, the capacity of the semiconductor memory is increased, a plurality of devices under test are concurrently tested, and if these factors are taken into consideration, memory costs are largely increased. In a test using the address fail memory, data may be overwritten in the same address in different time in some cases, and it becomes difficult to find the time when final failed data is written, and the number of occurrences of failures.

According to the second conventional configuration, it is possible to determine the overwriting of data on the same address, but a log memory having a large capacity must be prepared in a test in which it is assumed that many failures exists and thus, it is not possible to avoid the increase in memory costs. On the other hand, it is possible to divide one test, to interrupt a test pattern during the execution of the test, and to capture the log data through a plurality of steps. However, when the test pattern is interrupted, phenomenon of occurrence of failures is varied in the device under test due to its influence, and proper test can not be kept.

In the first or second conventional methods, it is difficult to refer to the test result during the execution of the test for the device under test, and a problem is caused when a test requiring long time such as one month is to be carried out.

SUMMARY OF THE INVENTION

It is an object of the present invention to realize a semiconductor memory test apparatus which does not require a large capacity log memory even when a test of a semiconductor memory is carried out for a long time and a large amount of log data is generated, and in which a test result can appropriately be referred to during the test and which can be configured inexpensively and easily.

An aspect of the present invention is a semiconductor memory test apparatus for testing a synchronous type semiconductor memory as a device under test using a predetermined test pattern comprising: log data generating means for generating log data indicating a test result of said device under test based on output data from said device under test corresponding to said test pattern; and log data storing means for writing said generated log data sequentially and reading said stored log data in accordance with a read request, wherein said log data storing means controls a write operation and a read operation of said log data asynchronously and independently, and said log data can be repeatedly read out during execution of a test by said read request.

According to the aspect of the present invention, when a test of a semiconductor memory which is a device under test is to be carried out, log data is generated by log data generating means based on output data obtained using a test pattern. By log data storing means, the generated log data are written sequentially, and the log data is read out from a storing region when a read request is received. The log data storing means can control a write operation and a read operation asynchronously and independently, and repeatedly read the log data during execution of one test. Further, the log data storing means can read out an enormous volume of log data through a plurality of times without increasing the capacity of the log data storing means. Therefore, especially when a long time test is to be executed, it is possible to reduce the memory cost, and to realize a semiconductor memory test apparatus which is suitable for detailed analysis of a test result.

In the semiconductor memory test apparatus of the present invention, said log data storing means may have a dual port structure including an input port and an output port.

In the semiconductor memory test apparatus of the present invention, said log data storing means may be a ring buffer controlled by a write pointer and a read pointer.

In the semiconductor memory test apparatus of the present invention, said log data storing means may output an empty signal which determines an empty state of a storing region and a full signal which determines a full state of said storing region.

In the semiconductor memory test apparatus of the present invention, said log data generating means may include expected value comparison means for comparing expected value data which is preset corresponding to said test pattern with output data from said device under test to determine whether or not said expected value data and said output data match with each other, and at least a determination result of said expected value comparison means may be included in said log data.

In the semiconductor memory test apparatus of the present invention, said log data generating means may include selection means for selecting and outputting said log data for each of a plurality of said devices under test, and may generate log data in which said log data of the plurality of said devices under test are integrally combined.

In the semiconductor memory test apparatus of the present invention, said log data generating means may further include buffer means for temporarily holding a predetermined amount of said log data of each of the plurality of said devices under test on an input side of said selection means.

In the semiconductor memory test apparatus of the present invention, when any of said log data of the plurality of said devices under test reaches said predetermined amount in said buffer means, output of said log data corresponding to said device under test which has reached said predetermined amount may be interrupted.

In the semiconductor memory test apparatus of the present invention, said semiconductor memory test apparatus may further comprise a counter unit for counting the number of failure bits generated in said device under test when a test using said test pattern is carried out.

According to the present invention, the log data indicating a test result of a device under test is generated, the log data storing means for reading and writing the log data is provided, and the log data storing means can control a write operation and a read operation asynchronously and independently. Therefore, even when an enormous volume of log data is to be generated during the execution of a long time test, it is unnecessary to provide a log memory having a large capacity. Further, according to the present invention, it is possible to freely read out log data during a test, and to realize an inexpensive and convenient semiconductor memory test apparatus that can be easily configured.

DETAILED DESCRIPTION OF THE INVENTION

A preferred embodiment of the present invention will be explained with reference to the drawings. In the embodiment, the invention is applied to a semiconductor memory test apparatus which is configured to carry out a test using predetermined test patterns for a DRAM having a synchronous type interface.

Figure 1:
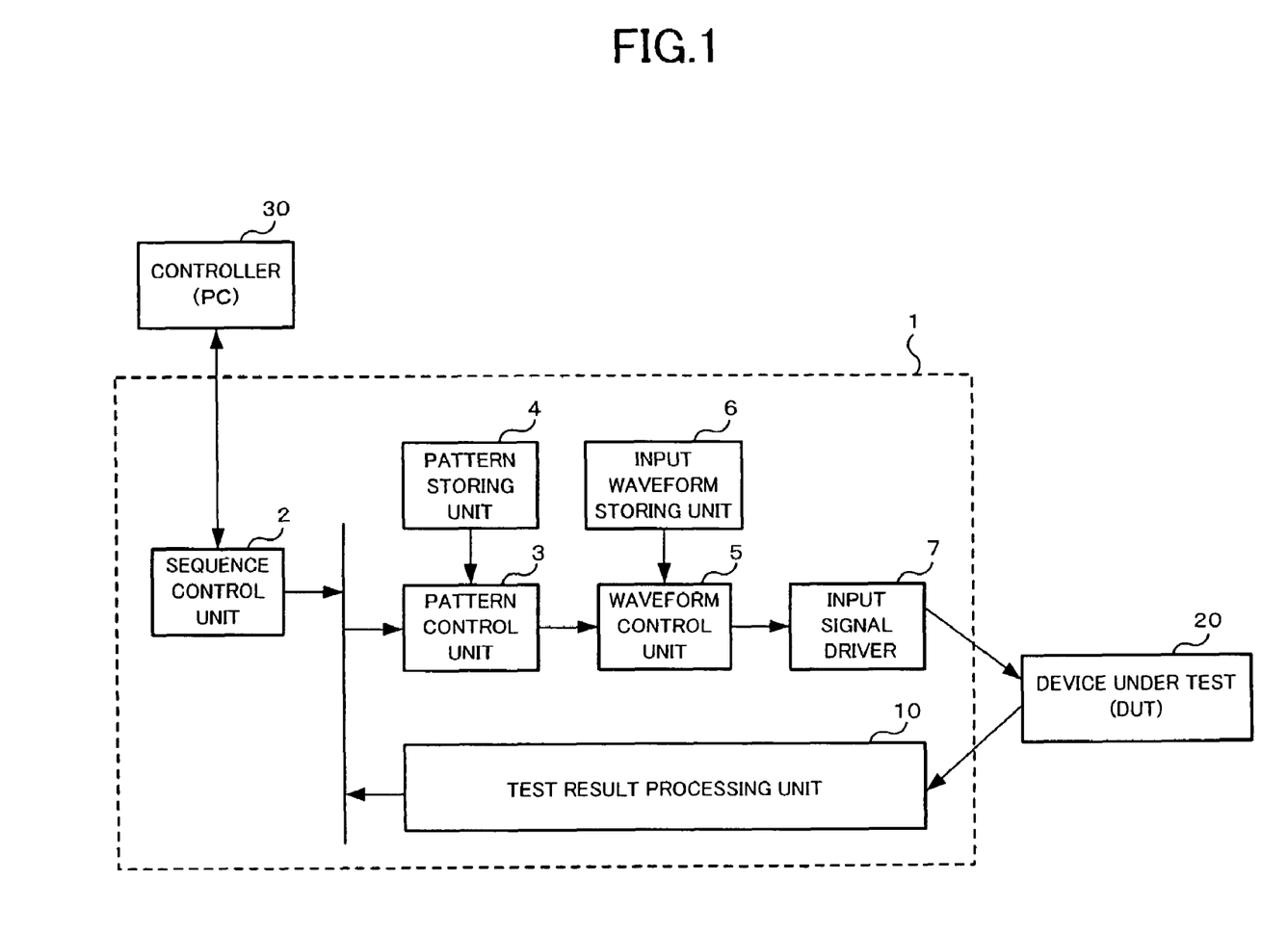
FIG. 1 is a block diagram showing the entire structure of a semiconductor memory test apparatus of the embodiment.

FIG. 1 is a block diagram showing the entire structure of a semiconductor memory test apparatus of the embodiment. A semiconductor memory test apparatus 1 shown in FIG. 1 carries out a test for a device under test (DUT) 20 which is a synchronous type DRAM. The semiconductor memory test apparatus 1 includes a sequence control unit 2, a pattern control unit 3, a pattern storing unit 4, an input waveform control unit 5, an input waveform storing unit 6, an input signal driver 7 and a test result processing unit 10. A controller 30 for controlling a test for the device under test 20 is connected to the semiconductor memory test apparatus 1 from outside.

A general personal computer (PC) can be used as the controller 30. The controller 30 includes storing means such as a hard disk drive, display means such as a display, and operating means such as a keyboard and a mouse. The controller 30 can execute a control program stored in the storing means to control a desired test carried out for the device under test 20. A test pattern used for the semiconductor memory test apparatus 1 can be set and log data indicative of a test result of the device under test 20 can be captured in accordance with operations of the controller 30.

The sequence control unit 2 executes sequence command indicating the procedure of test contents set by the controller 30, and controls an operation of the pattern control unit 3 at a predetermined timing. The pattern control unit 3 reads out a test pattern suitable for the sequence command from the pattern storing unit 4, and sends it to the input waveform control unit 5. The input waveform control unit 5 selects a combination of predetermined input waveforms corresponding to the test pattern, and reads out data for the waveforms from the input waveform storing unit 6. The input signal driver 7 generates an input signal which drives the device under test 20 based on the combination of the input waveforms. As will be described later, the semiconductor memory test apparatus 1 is configured such that a test can be carried out for a plurality of devices under test 20. The input signal driver 7 is configured such that a plurality of input signals is generated to drive the plurality of devices under test 20 at the same time.

The test result processing unit 10 analyzes a test result using output data which is read out from the device under test 20 when the test is carried out, and generates and stores log data indicative of the test result. The test result processing unit 10 functions as log data generating means and log data storing means of the present invention. Specific structure and operation of the test result processing unit 10 will be described later. The log data generated by the test result processing unit 10 is written to a later-described log memory of the test result processing unit 10. As will be described later, the controller 30 can obtain log data from the log memory if necessary, and can refer to the log data at desired timing during the execution of a test and after the completion of the test.

Many elements of the semiconductor memory test apparatus 1 of the embodiment can be constructed using FPGA (Field Programmable Gate Way), for example. If the FPGA is utilized, since a circuit configuration can easily be changed, the semiconductor memory test apparatus 1 can be modified in accordance with a specification of the device under test 20, and the entire device can be configured inexpensively.

Figure 2:
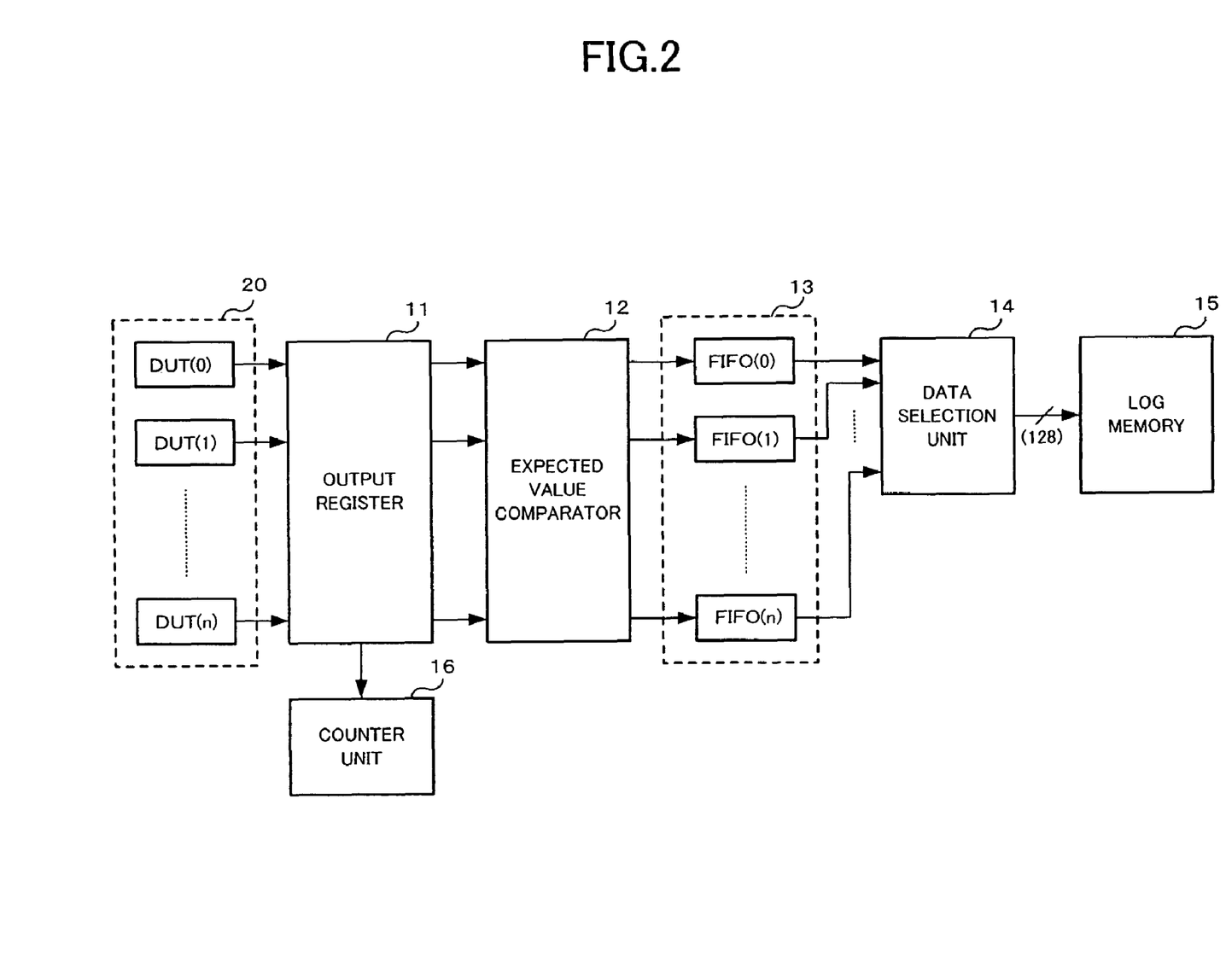
FIG. 2 is a block diagram showing an outline structure of a test result processing unit.
Figure 3:
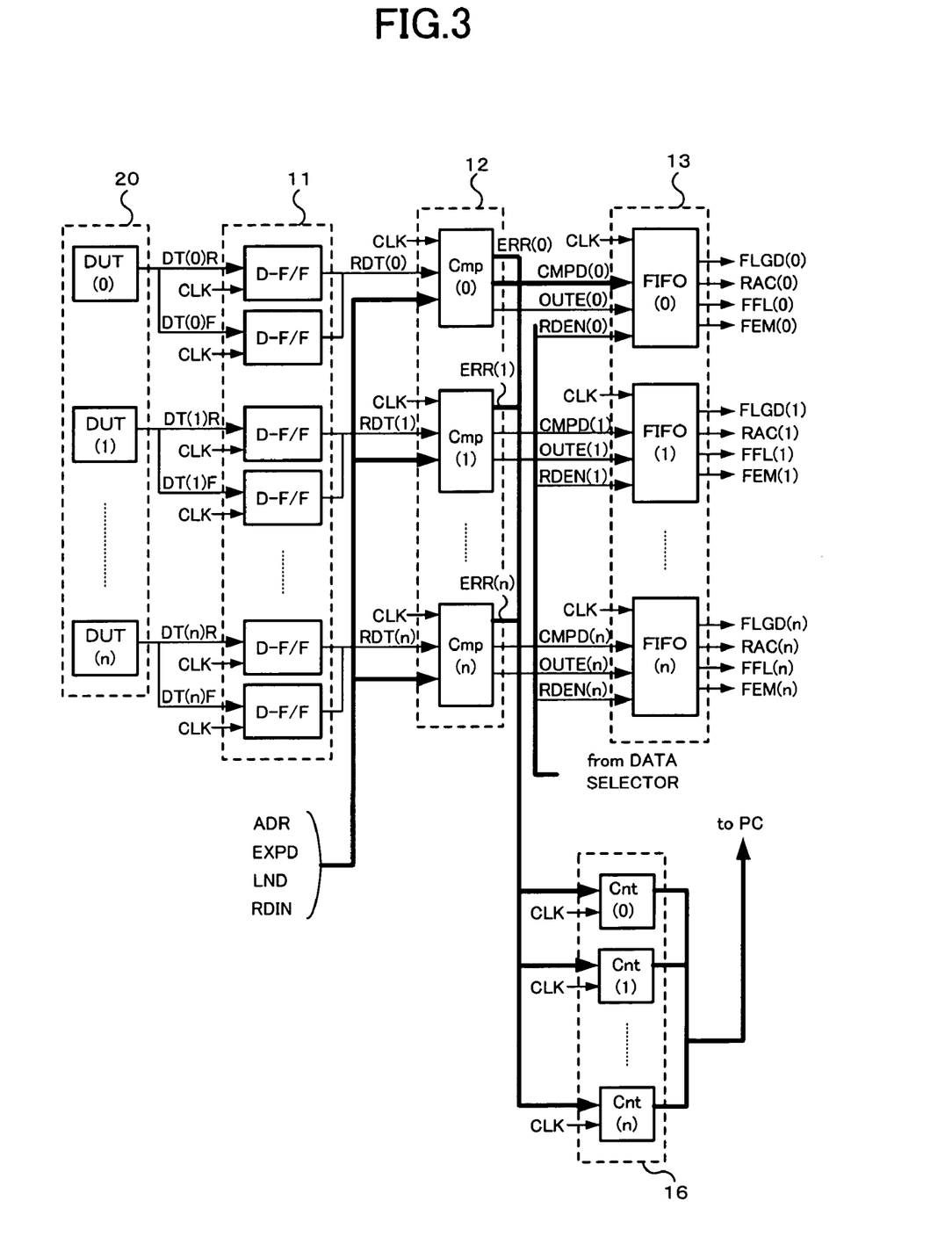
FIG. 3 is a first block diagram showing a detailed structure corresponding to FIG. 2.
Figure 4:
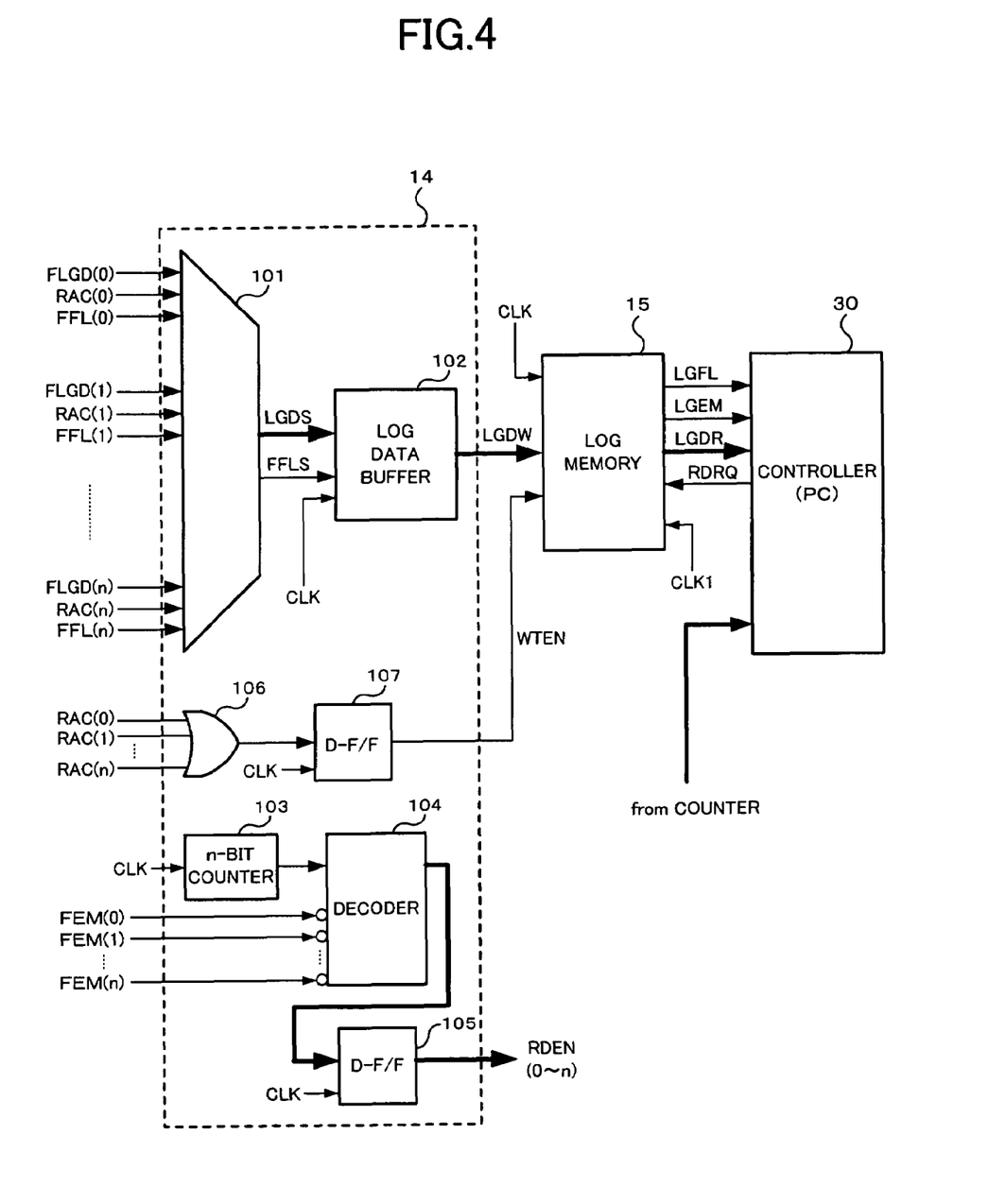
FIG. 4 is a second block diagram showing the detailed structure corresponding to FIG. 2.

Next, the structure and operation of the test result processing unit 10 will be explained using FIGS. 2 to 10. FIG. 2 is a block diagram showing an outline structure of the test result processing unit 10, FIGS. 3 and 4 are block diagrams showing a detailed structure corresponding to FIG. 2, and FIGS. 5 to 7 are waveform diagrams showing signal waveforms in the test result processing unit 10. The following description is based on a case in which a plurality of devices under test 20 are set in the semiconductor memory test apparatus 1 and a test can be carried out for these devices under test 20 at the same time.

As the devices under test 20, synchronous type semiconductor memories such as DDR-SDRAM (Double Data Rate Synchronous DRAM) is used.

As shown in FIG. 2, the test result processing unit 10 includes an output register 11, an expected value comparator (expected value comparison means) 12, a data buffer (buffer means) 13, a data selection unit (selection means) 14, a log memory 15 and a counter unit 16. The n+1 number of DUTs (0 to n) having Nos. 0 to n are used as the devices under test 20, and a test is carried out for these n+1 DUTs at the same time. In the devices under test 20, the number of I/O generally corresponds to a plurality of bits (e.g., ×8 bits), but this is omitted from the drawings. In the waveform diagrams in FIGS. 5 and 6, signal waveforms of i-th DUT (i) of 0 to n are shown.

The output register 11 comprises a D flip-flop (D-F/F) group for holding output data from each of n+1 DUTs (0 to n) when a test is carried out on the device under test 20. Here, as shown in FIG. 3, two D flip-flops are connected to each of DUTs (0 to n). This is a structure corresponding to synchronous data transfer with respect to both edges (rise edge and fall edge) of a synchronous clock CLK in the DDR-SDRAM. As shown in the waveform diagram of FIG. 5, rise edge output data DT (i)R and fall edge output data DT (i)F delayed by half cycle are output from the DUT (i) in synchronization with the clock CLK. The output data DT (i)R and DT (i)F are temporarily held in each D flip-flop and synthesized on the output side. Thereby, read data RDT (i) in which both the rise edge and fall edge output data DT (i)R and DT (i)F are integrally formed can be obtained.

Figure 5:
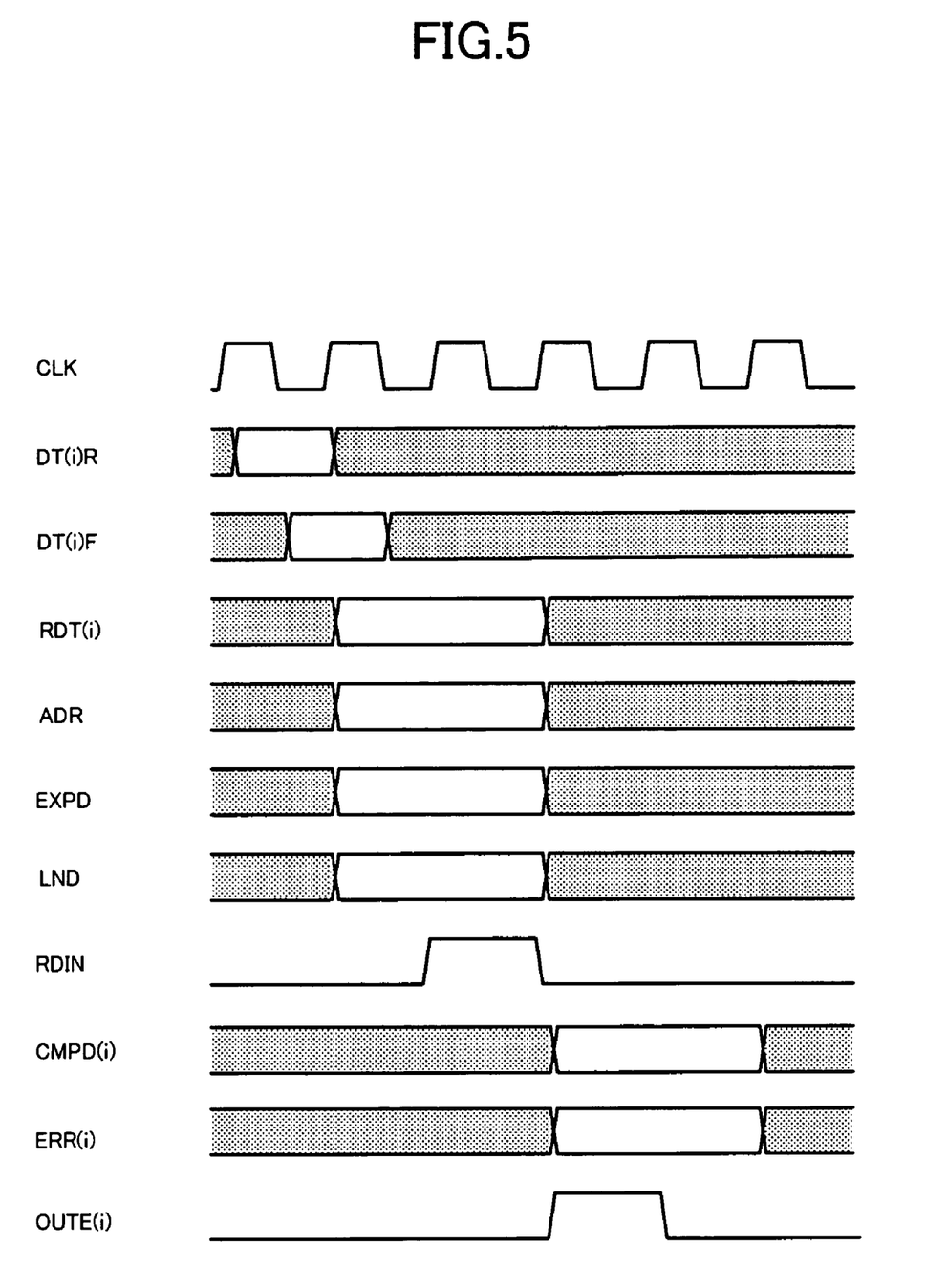
FIG. 5 is a first waveform diagram showing signal waveforms in the test result processing unit.
Figure 6:
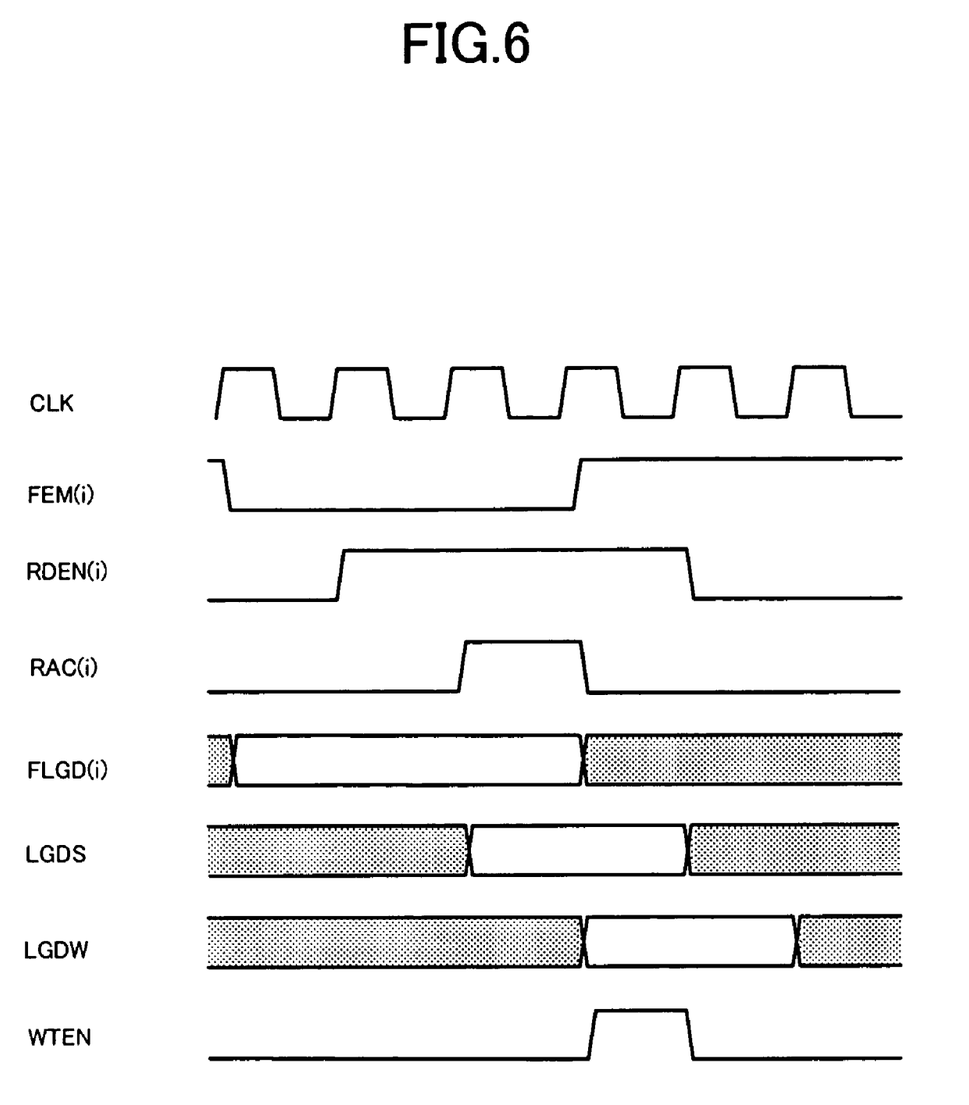
FIG. 6 is a second waveform diagram showing signal waveforms in the test result processing unit.
Figure 7:
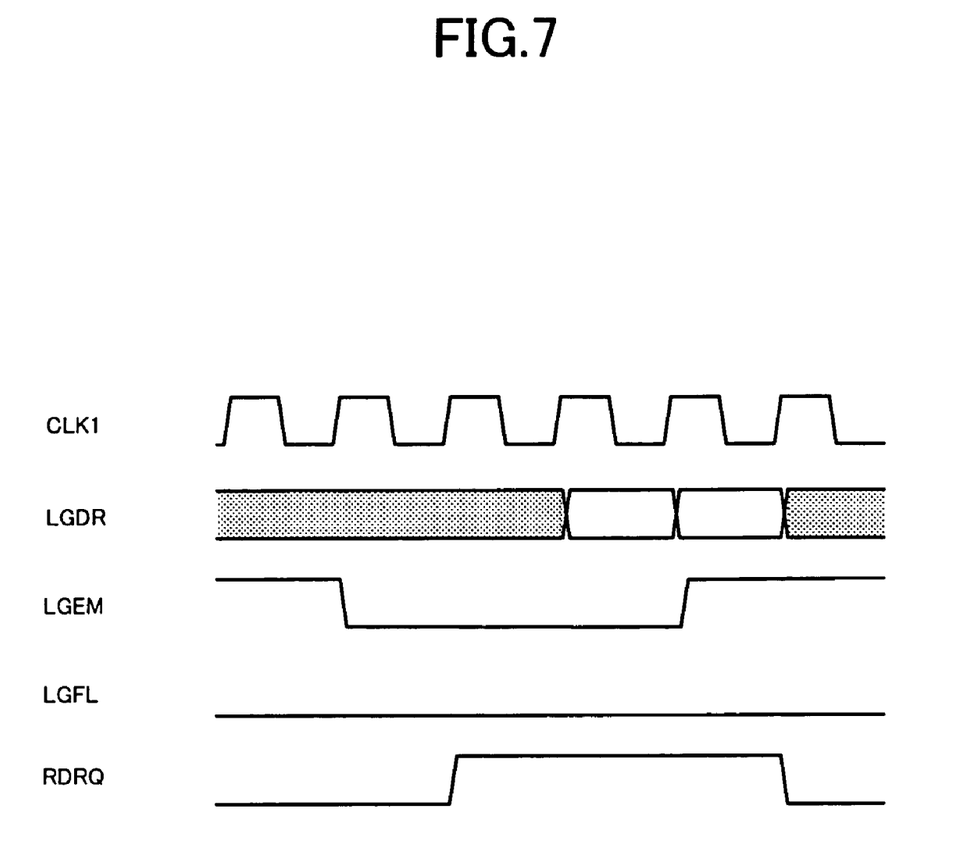
FIG. 7 is a third waveform diagram showing signal waveforms in the test result processing unit.

In addition, in the waveform diagrams in FIGS. 5 to 7, a distinction is made between effective regions (void portions) in signals and ineffective regions (hatching portions). In the case of FIG. 5, it can be found that in each of the rise edge and fall edge output data DT (i)R and DT (i)F, an effective region exists for one cycle of the clock CLK, and in the read data RDT (i), an effective region exists for two cycles of the clock CLK.

The expected value comparator 12 compares read data RDT (0 to n) obtained from the output register 11 with expected value data EXPD which is preset in correspondence with the test pattern. As shown in FIG. 3, the expected value comparator 12 comprises n+1 comparators Cmp (0 to n), and in each of the comparators, the read data RDT (0 to n) corresponding to DUTs (0 to n) and the expected value data EXPD are compared with each other. An address ADR of the device under test 20 required when a test is executed, line number data LND attached with the test pattern, and an capturing signal RDIN which is used for capturing timing to capture the read data RDT (0 to n) are supplied to the expected value comparator 12 under the control of the outside controller 30.

Comparator data CMPD (0 to n) which is output from the expected value comparator 12 includes data obtained when determining whether the read data RDT (0 to n) and the expected value data EXPD are matched with each other or not, and is constituted as data in which the address ADR and the line number data LND are integrally combined with the former data. When the read data RDT (0 to n) and the expected value data EXPD are mismatched with each other, an output enable signal OUTE (0 to n) informing the subsequent data buffer 13 of its timing, and an error signal ERR (0 to n) indicative of the contents of the failure at that time are output from the expected value comparator 12.

As shown in the waveform diagram in FIG. 5, in the i-th comparator Cmp (i), the read data RDT (i), the expected value data EXPD, the address ADR and the line number data LND are obtained at a timing defined by a pulse of the capturing signal RDIN, and the above-described comparison is carried out. After a predetermined time is elapsed, the comparator data CMPD (i) and the error signal ERR (i) become effective and are output, a pulse having a predetermined width of the output enable signal OUTE (i) is output at the same timing.

The speed of the output data in the device under test 20 and the transfer speed of the log memory 15 are different. The data buffer 13 is provided for temporarily buffering data to adjust both speeds. The data buffer 13 includes n+1 FIFOs (0 to n) which store n+1 comparator data CMPD (0 to n) which are output from the expected value comparator 12. In each of the FIFOs (0 to n), the comparator data CMPD (0 to n) corresponding thereto are captured in synchronization with pulses of the output enable signals OUTE (0 to n) output from the expected value comparator 12.

The FIFOs (0 to n) in the data buffer 13 may have either a multistage buffer structure or a ring buffer structure. The number of FIFOs (0 to n) (the number of bits) may be 8 or 16, and may be appropriately set in accordance with using condition. If the number of FIFO is increased, the speed adjusting ability between different speeds in the data buffer 13 can be enhanced.

As shown in FIG. 3, output to the subsequent data selection unit 14 from the FIFOs (0 to n) of the data buffer 13 are FIFO log data FLGD (0 to n) corresponding to the held comparator data CMPD (0 to n), read response signals RAC (0 to n) which respond at a reading timing of the FIFO log data FLGD (0 to n), FIFO full signals FFL (0 to n) indicating whether the FIFOs (0 to n) are written or not, and FIFO empty signals FEM (0 to n) indicating whether the FIFOs (0 to n) are empty or not. Read enable signals RDEN (0 to n) which are output from the data selection unit 14 are supplied to the FIFOs (0 to n) and with this, the reading operation of the comparator data CMPD (0 to n) is carried out by the FIFOs (0 to n).

As shown in the waveform diagram in FIG. 6, in the FIFO empty signal FEM (i), when the state is shifted from an empty state (high level) to a non-empty state (low level), a pulse of the read enable signal RDEN (i) rises in accordance with a later-described operation. The FIFO (i) which has received this reads the comparator data CMPD (i), activates the read response signal RAC (i) and outputs the pulse. It is possible to determine the read timing of the FIFO (i) based on the timing of the pulse output of the read response signal RAC (i).

The error signal ERR from the expected value comparator 12 is input to the counter unit 16. The counter unit 16 comprises n+1 counters Cnt (0 to n). Corresponding error signals ERR (0 to n) are respectively input to the counters Cnt (0 to n), and the number of failure bits generated when the DUTs (0 to n) are tested is counted sequentially. As shown in FIG. 3, since count values in the counters Cnt (0 to n) are sent out to the external controller 30, the number of failure bits generated in the DUTs (0 to n) can be confirmed in the controller 30 at a desired time.

Even if a burst error exceeding processing ability of the semiconductor memory test apparatus 1 is generated in any of the DUTs (0 to n) and the test is interrupted, since the controller 30 can refer to the number of failure bits of the counter unit 16, it is possible to know the state of the failure data to some extent.

Although it is not illustrated in FIG. 3, it is necessary that the number of stages of an arbitrary counter Cnt (i) is the same as the number of the bits of the address of DUTs (i), and that separate counters for Cnts (i) of which the same number as the number of I/O are provided.

Next, in FIG. 4, the data selection unit 14 includes a selector 101, a log data buffer 102, an n-bit counter 103, a decoder 104, a D flip-flop 105, an OR circuit 106 and a D flip-flop 107.

In the selector 101, FIFO log data FLGD (0 to n) are input from the FIFOs (0 to n) of the data buffer 13, and a FIFO (i) indicated by the read enable signal RDEN (i) is selected. The FIFO log data FLGD (i) is selected and output, and is sent to the subsequent log data buffer 102 as selected log data LGDS. At that time, a full signal FFL (i) of the selected FIFO (i) is also selected and output, and this is sent to the log data buffer 102 as a selected full signal FFLS.

The log data buffer 102 comprises FIFOs suitable for bit width of the selected log data LGDS. The log data buffer 102 holds the selected log data LGDS received through the selector 101 and then, transfers the same to the log memory 15 as write log data LGDW. As shown in the waveform diagram in FIG. 6, these FIFO log data FLGD, selected log data LGDS and write log data LGDW are output in time relation as shown in the waveform diagram in FIG. 6.

The n-bit counter 103 is an n-stage counter which directly counts the clock CLK. By the count value of the n-bit counter 103, each of the DUTs (0 to n) can be selected in the order. The decoder 104 inputs the count value of the n-bit counter 103 and reversed signals of empty signals FEM (0 to n) of the FIFOs (0 to n), and determines FIFOs (0 to n) to be read. That is, when the empty signal FEM (i) of the FIFO (i) indicated by the count value of the n-bit counter 103 is not in the empty state, this is determined as a target to be read. An output of the decoder 104 is held by the D flip-flop 105 and then, this is output as the read enable signals RDEN (0 to n) and fed back to the data buffer 13.

In the OR circuit 106, the read response signals RAC (0 to n) are input from the FIFOs (0 to n) of the data buffer 13, a logical sum thereof is output to the D flip-flop 107. Thereby, it is possible to determine the timing at which the log data is renewed in any of the n+1 FIFOs (0 to n). In the D flip-flop 107, an operation output of the OR circuit 106 is set, a pulse which is delayed by a predetermined time in synchronization with the clock CLK (see FIG. 6) is generated, and this is sent to the log memory 15 as a write enable signal WTEN.

Figure 8:
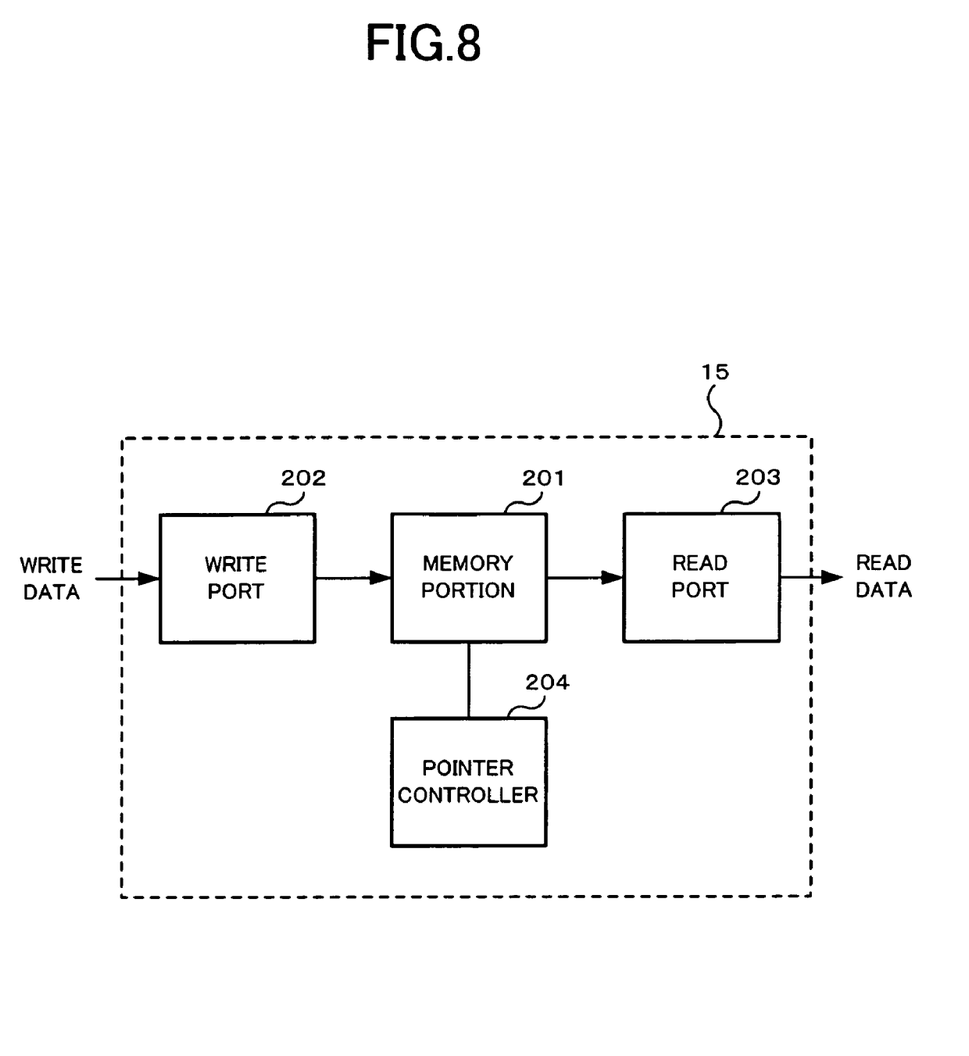
FIG. 8 is a diagram showing a basic structure of a log memory.

Next, the log memory 15 is an asynchronous and dual port memory which stores write log data LGDW sent from the data selection unit 14 sequentially. The structure and operation of the log memory 15 will be explained using FIGS. 8 and 9. FIG. 8 shows a basic structure of the log memory 15. As shown in FIG. 8, the log memory 15 includes a memory portion 201, a write port 202 for writing data, and a read port 203 for reading data. Further, the log memory 15 includes a pointer controller 204 when the log memory 15 is controlled as a later-mentioned ring buffer. A structure and a size of the memory portion 201 may be selected in accordance with a kind of the device under test 20 and test contents, but an FIFO of 123 bit×16384 stages can be used.

The write data to be input to the log memory 15 is stored and held in a predetermined region of the memory portion 201 through the write port 202, and read data to be output from the log memory 15 is read out from a predetermined region of the memory portion 201 and is sent outside through the read port 203. Since the log memory 15 has the dual port structure which is separately provided with the write port 202 and the read port 203, writing operation and reading operation with respect to the memory portion 201 can independently and asynchronously be carried out. As an entity for the structure of the memory portion 201 of the log memory 15, a general asynchronous type FIFO can be used.

Figure 9:
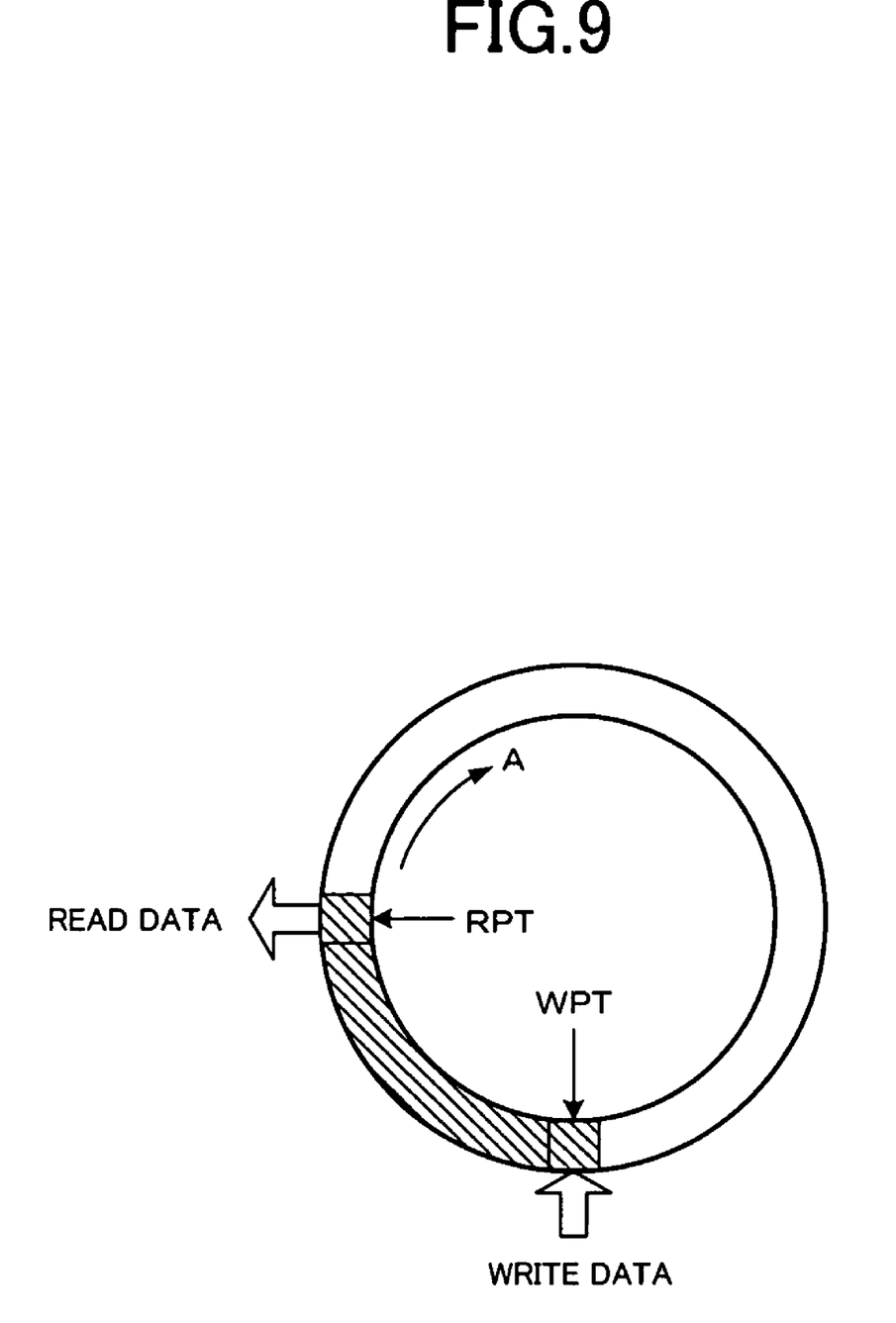
FIG. 9 is a diagram showing a concept of a ring buffer structure in the log memory.

FIG. 9 shows a concept of the ring buffer structure in the log memory 15. That is, in the ring buffer structure employed in the log memory 15, write data is written in a region of the memory portion 201 indicated by a write pointer WPT, and read data is read out from a region of the memory portion 201 indicated by a read pointer RPT. Effective log data to be read out is stored in a data region from the top corresponding to the write pointer WPT to the last corresponding to the read pointer RPT.

In FIG. 9, when continuing the reading operation of data, if the read pointer RPT becomes equal to the write pointer WPT, the log memory 15 becomes empty. On the other hand, if the write pointer WPT is controlled on the basis of the read pointer RPT as a starting point for controlling the position of the ring buffer (in an arrow A direction for example), the log memory 15 becomes full when the write operation is carried out in one circle. Therefore, in the ring buffer structure, it is required to always control the read pointer RPT such that an appropriate position of the read pointer RPT is maintained with respect to the write pointer WPT so that an effective data region is secured in a portion of the ring buffer while avoiding the empty or full state. In this case, if the read timing is appropriately set while securing the data region of the log memory 15, the read operation can reliably be carried out even if the speed of the write operation and the speed of the read operation are different from each other.

A read request signal RDRQ is sent from the external controller 30 to the log memory 15 at a desired timing of confirmation of the test result to refer to the log memory 15. Then the log memory 15 reads the read log data LGDR from a currently effective data region in the memory portion 201 and transfers it to the controller 30. As shown in FIG. 7, the transfer operation of the read log data LGDR is carried out in synchronization with a transfer clock CLK1 which is set lower speed (longer period) than the clock CLK. Frequency suitable for an interface of the controller 30 is selected for the transfer clock CLK1, and the frequency is set to 33 kHz for example.

The read log data LGDR which is held in the memory portion 201 at that time is obtained at a timing instructed by the controller 30 and is stored in a storage device such as a hard disk. In the log memory 15, a log full signal LGFL for determining a full state of the memory portion 201 and a log empty signal LGEM for determining an empty state of the memory portion 201 are sent to the controller 30. In the controller 30, during the execution of a test pattern for a long term, it is necessary to capture the read log data LGDR from the log memory 15 at relatively short intervals in such a range that the memory portion 201 is not brought into full/empty states.

At the time of one test executed by the semiconductor memory test apparatus 1, the number of times in which the controller 30 captures the read log data LGDR is not especially limited. That is, in the controller 30, log data corresponding to one test is constituted as aggregation of read log data LGDR captured through many tests. Therefore, when a test is carried out by the semiconductor memory test apparatus 1 for a long time (e.g., one month), even if the entire log data is enormous, the size of each of the read log data LGDR can be small by frequently carrying out the read operation by the controller 30. As a result, it is unnecessary to increase the log memory 15 in size, and increase in cost can be avoided.

Figure 10:
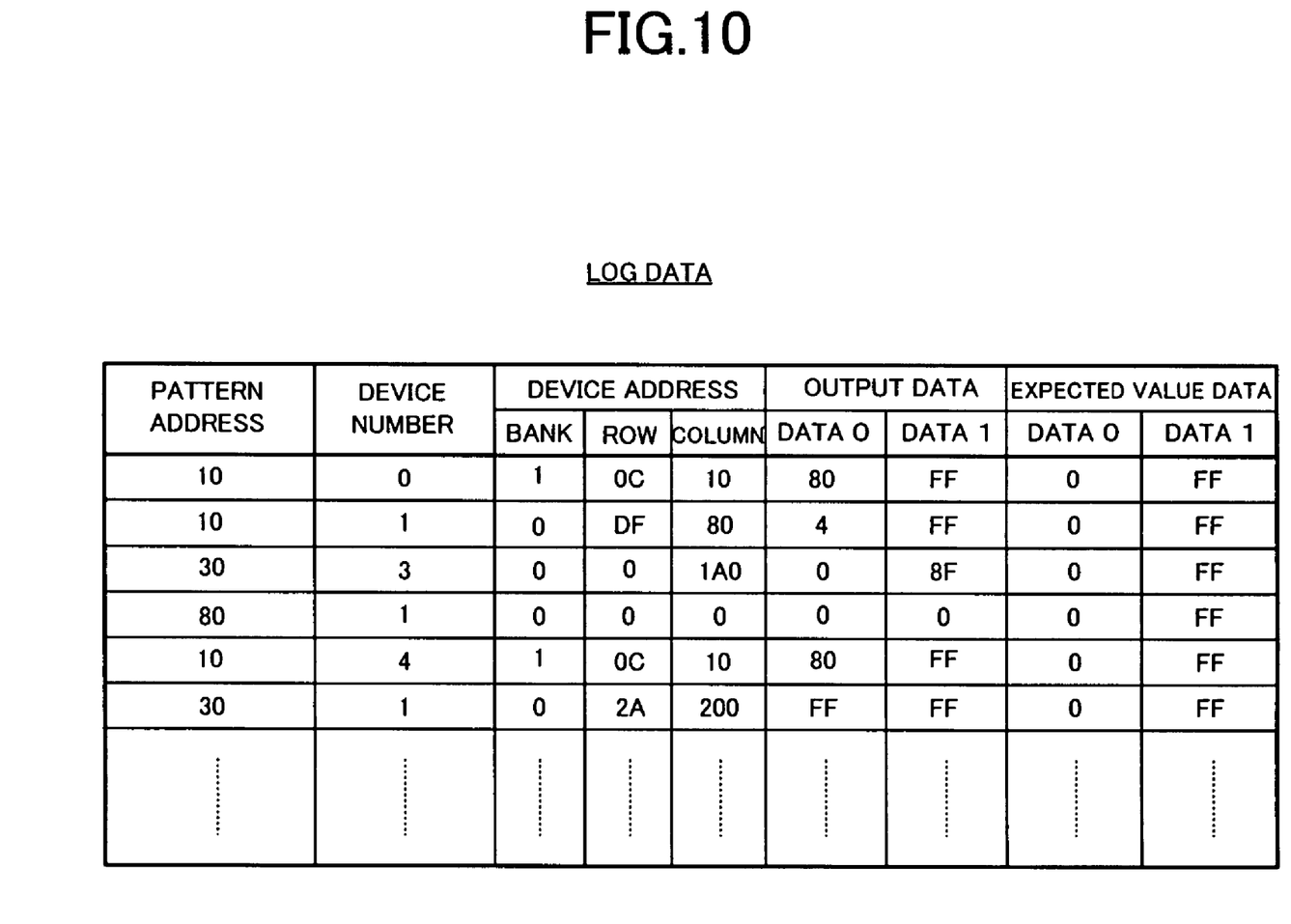
FIG. 10 is a diagram used for explaining a specific example of contents of log data in the embodiment.

A specific example of contents of the log data in the embodiment will be explained using FIG. 10. The log data shown in FIG. 10 includes data items comprising a pattern address (line number) included in a test pattern, device number for identifying a target DUT, and device address/output data/expected value data related to the DUT when a test is executed. The data items are stored as log data sequentially in accordance with a time series of the test execution. As shown in FIG. 10, the log data is stored when output data and expected value data of the test result based on the test pattern are different from each other, i.e., when failure data is generated. Therefore, the size of the log data is varied in accordance with the frequency of the generation of the failure data even with the same test. Here, in the log data, since the data items are described along the time series during the test, even if there is a plurality of failures at a particular address of the device under test 20 and data is overwritten, the respective failure data can individually be determined. Therefore, inconvenience caused by an address fail memory is used can be avoided.

The contents of the log data of the embodiment is not limited to the specific example shown in FIG. 10, and the log data may include various data items and contents if the test result can be discriminated.

Figure 11:
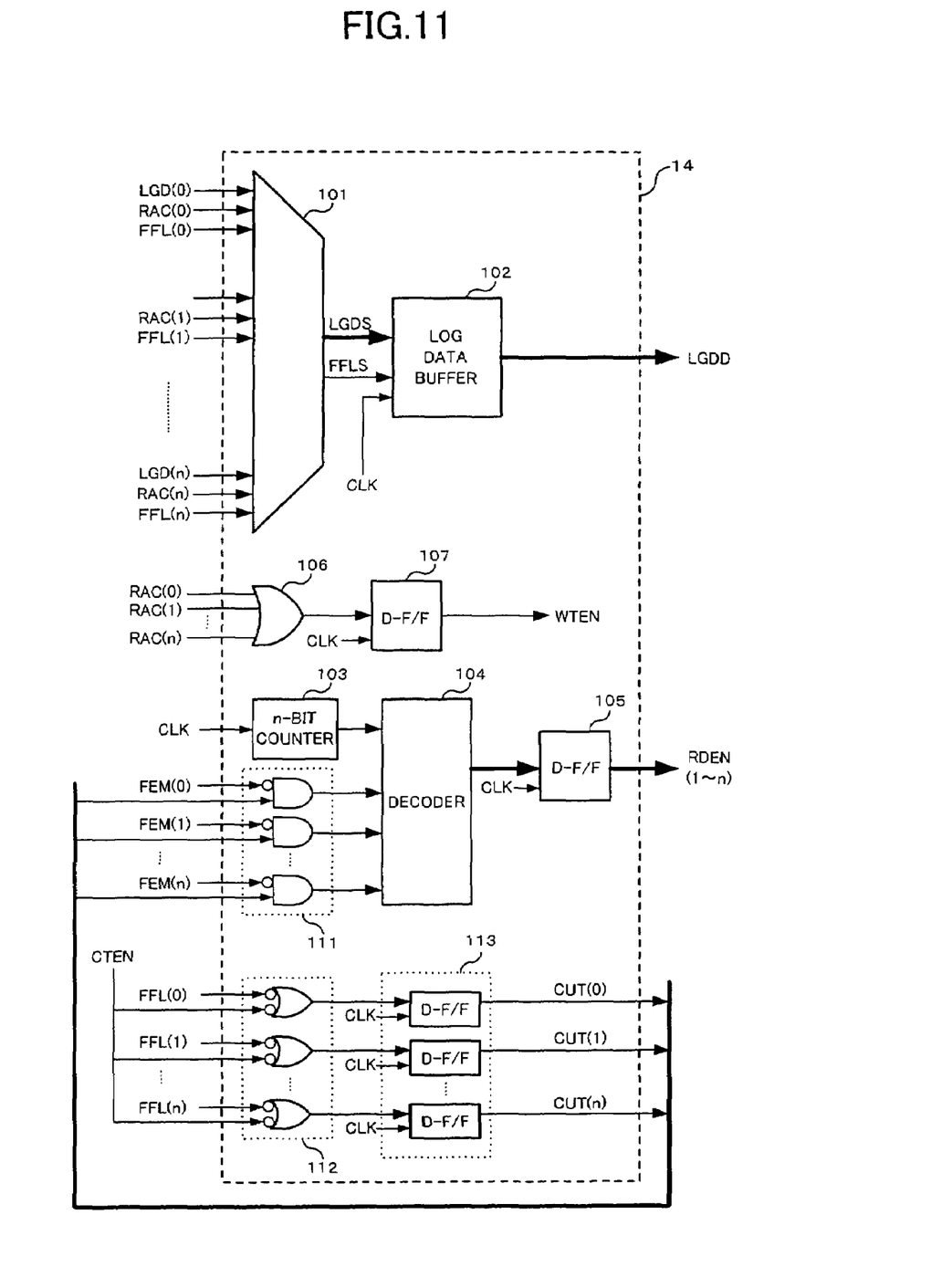
FIG. 11 is a diagram showing a modification in which data reading interruption function is added in a structure of a data selection unit of the embodiment.

Next, a modification of the semiconductor memory test apparatus 1 in the embodiment will be explained. FIG. 11 shows the modification in which data reading interruption function is added to the data selection unit 14 of the embodiment. The modification shown in FIG. 11 is different from the data selection unit 14 shown in FIG. 4 in that an AND circuit unit 111, an OR circuit unit 112 and a D flip-flop unit 113 are provided.

The AND circuit unit 111 comprises n+1 AND circuits. Reversed signals of the FIFO empty signals FEM (0 to n) and later-described interruption signals CUT (0 to n) are input to the AND circuit unit 111. The OR circuit unit 112 comprises n+1 OR circuits. Reversed signals of the FIFO full signals FFL (0 to n) and reversed signals of an interruption control signal CTEN are input to the OR circuit unit 112. The output of the OR circuit unit 112 is input to the D flip-flop unit 113 and held therein and then, is output as the interruption signals CUT (0 to n).

In such a configuration, effective and ineffective of the interruption function can be switched by the interruption control signal CTEN. If an arbitrary FIFO (i) of the data buffer 13 becomes full and the full signal FFL (i) is output while the interruption function is effective, the interruption signal CUT (i) is output through the OR circuit unit 112 and the D flip-flop unit 113. In a state in which the interruption signal CUT (i) is output, the read enable signal RDEN (i) is not activated through the AND circuit unit 111 and the decoder 104. When an arbitrary FIFO (i) becomes empty also, the read enable signal RDEN (i) is not activated. Therefore, even if an enormous amount of failure data is continuously generated in an arbitrary DUT (i), since the corresponding FIFO (i) is interrupted, it is possible to prevent the log memory 15 from being largely consumed, and storing capacity can effectively be used. It is also possible to perform control such that the interruption control signal CTEN is switched to an ineffective state and to store log data corresponding to continuous generation of failures in the log memory 15, and to appropriately select the presence and absence of the interruption function in accordance with a state of a test.

Although the present invention has been concretely explained based on the embodiment, the invention is not limited to the embodiment, and it is possible to make various modifications within a range not departing from the subject matter. For example, a kind of the semiconductor memory as the device under test 20, structures and operations of the output register 11, the expected value comparator 12, the data buffer 13, the data selection unit 14 and the like included in the structure shown in FIG. 2 are not limited to those described in the embodiment, and the invention can be applied widely.

The invention claimed is:

1. A test apparatus comprising:
a log data generating unit generating a plurality of log data indicative respectively of test results of a plurality of devices under test in response to data outputted from the devices under test;
a plurality of first buffers each coupled to the log data generating unit to temporarily store an associated one of the log data indicative respectively of the test results of the devices under test;
a selector unit coupled to each of the first buffers to select one of the first buffers, the selector unit thereby outputting the log data temporarily stored in the first buffers in series in order of selection of the first buffers;
a second buffer coupled to the selector unit to temporarily store the log data outputted from the selector unit and outputting the log data temporarily stored therein; and
a log data storing unit having an input terminal coupled to the second buffer to receive the log data and an output terminal, the log data storing unit storing the log data on the input terminal in response to a write request and outputting the log data stored therein onto the output terminal in response to a read request which is made asynchronously with and independently of the write request, wherein one or more of the log data, which have already been stored in the log data storing unit, may be read out therefrom prior to writing subsequent one or more of the log data into the log data storing unit.

2. The apparatus as claimed in claim 1, wherein the log data storing unit comprises a dual port structure having an input port coupled to the input terminal and an output port coupled to the output terminal.

3. The apparatus as claimed in claim 1, wherein the log data storing unit comprises a ring buffer controlled by a write pointer responsive to the write request and an a read pointer controlled by the read request.

4. The apparatus as claimed in claim 1, wherein the log data generating unit includes a comparator unit comparing the data outputted from the device under test with expected data, and the device under test is a synchronous memory device.

5. The apparatus as claimed in claim 1, wherein each of the first and second buffers comprises a FIFO memory.

* * * * *